United States Patent [19]

Frey

[11] 4,161,740

[45] Jul. 17, 1979

[54] HIGH FREQUENCY POWER TRANSISTOR HAVING REDUCED INTERCONNECTION INDUCTANCE AND THERMAL RESISTANCE

[75] Inventor: Richard H. Frey, Hampton, N.J.

[73] Assignee: Microwave Semiconductor Corp., Somerset, N.J.

[21] Appl. No.: 849,302

[22] Filed: Nov. 7, 1977

[51] Int. Cl.² ........................................... H01L 29/72
[52] U.S. Cl. ...................... 357/36; 357/40; 357/52; 357/54; 357/55; 357/68; 357/71
[58] Field of Search .................. 357/36, 40, 52, 54, 357/68, 55, 71

[56] References Cited

U.S. PATENT DOCUMENTS 4,024,568  5/1977  Yoshimura ............................. 357/36

Primary Examiner—Edward J. Wojciechowicz
Attorney, Agent, or Firm—Pennie & Edmonds

[57] ABSTRACT

A transistor having small, closely spaced emitter and base contact areas and an active area capable of generating heat to be removed, is provided with an electrode structure comprising a finger electrode for connecting emitter or base contact areas with one or more bonding pads beside the active area and, electrically insulated from the finger electrode, a bonding plate electrode overlaying at least a portion of the active area for electrically contacting the base or emitter contact areas, respectively. This contact structure has reduced interconnection inductance and resistance, reduced MOS capacitance, and reduced thermal resistance. In addition, it provides a structure which is suitable for both conventional and flip chip mounting.

4 Claims, 5 Drawing Figures

HIGH FREQUENCY POWER TRANSISTOR HAVING REDUCED INTERCONNECTION INDUCTANCE AND THERMAL RESISTANCE

BACKGROUND OF THE INVENTION

The present invention relates to high frequency power transistors, and, more specifically, to high frequency power transistors having an improved contact structure.

High frequency power transistors typically utilize small, closely spaced emitter and base contact areas connected to bonding pads remote from the active areas of the transistor where heat is generated. Small, closely spaced emitter and base contact areas are utilized because emitter injection is largely concentrated at the periphery at high current levels rather than being uniformly distributed over the entire emitter area. Consequently, it is important to have large peripheries between emitter and base areas in order to obtain large currents and thus obtain high levels of power.

A typical microwave power transistor utilizes a relatively large area base pocket including a plurality of rows of tiny emitter sites (contact areas), such rows being closely spaced between successive base contact areas. The emitter metalization pattern typically comprises a finger electrode structure connected to a bonding pad at one side of the base pocket. The "fingers" extend across successive rows of emitter sites in the base pocket and thus "overlay" the base region between successive sites. The base metalization pattern also comprises a finger electrode structure interleaved with the first and connected to a bonding paid on the opposite side of the base pocket.

A number of electrical characteristics of the contact structure limit the frequency response, bandwidth, and power output of microwave power transistors. Such limiting characteristics include inductance and resistance in the device-to-packaging interconnection system, voltage drops in the emitter and base metal pattern contacts, and MOS capacitance between the emitter plate and base bond pads and the silicon substrate.

Heat also poses a serious problem to the performance and operating life of such transistors. Heat generated at the collector-base junction, near the surface of the transistor, can lead to a temperature buildup which can cause metal to diffuse and eventually short-circuit the emitter and base.

Because high frequency power transistors utilize small, closely-spaced emitter and base contact areas, it is particularly difficult to remove heat from the active area of the transistor. Bonding wires, which can be one path of heat removal, are generally connected to bonding pads remote from the closely spaced electrodes disposed over the active areas. Consequently, there is substantial thermal resistance between the active area and the bonding wires.

The closely spaced electrode structures of typical high frequency, high-power transistors have also effectively precluded the use of "flip chip" mounting to remove heat. In flip chip mounting, the transistor is "flipped" and mounted with its electrodes bonded to corresponding bonding pads on a heat sink and its active surface in thermal contact with the heat sink through the electrode bonding. This approach, however, is impractical with high frequency, high power transistors because the closely spaced electrode structure over the active area (1) presents substantial thermal resistance between the active area and any remote bonding points, and (2) presents insoluble alignment problems precluding direct bonding of the fine electrode structure to a corresponding fine structure on the heat sink. Moreover, even if alignment were possible, the emitter and base electrodes are so closely spaced, i.e., on the order of 0.1 mil, that conventional bonding techniques, such as soldering or ultrasonic bonding, would short the two electrode structures.

Accordingly, there is a need for an improved contact structure for microwave power transistors.

SUMMARY OF THE INVENTION

In accordance with the present invention, a transistor having small, closely spaced emitter and base contact areas and an active area capable of generating heat to be removed, is provided with an electrode structure comprising a finger electrode for connecting emitter or base contact areas with one or more bonding pads beside the active area and, electrically insulated from the finger electrode, a bonding plate electrode overlying at least a portion of the active area for electrically contacting the base or emitter contact areas, respectively. This contact structure has reduced interconnection inductance and resistance, reduced MOS capacitance, and reduced thermal resistance. In addition, it provides a structure which is suitable for both conventional and flip chip mounting.

BRIEF DESCRIPTION OF THE DRAWINGS

The nature, advantages, and various features of the invention will appear more fully upon consideration of the illustrative embodiments now to be described in detail in connection with the accompanying drawings.

In the drawings.

For convenience of reference, similar structural elements are given the same reference numerals throughout the drawing.

DETAILED DESCRIPTION OF THE DRAWINGS

A. Preferred Embodiment of Modified Overlay Type Transistor

Figure 1:
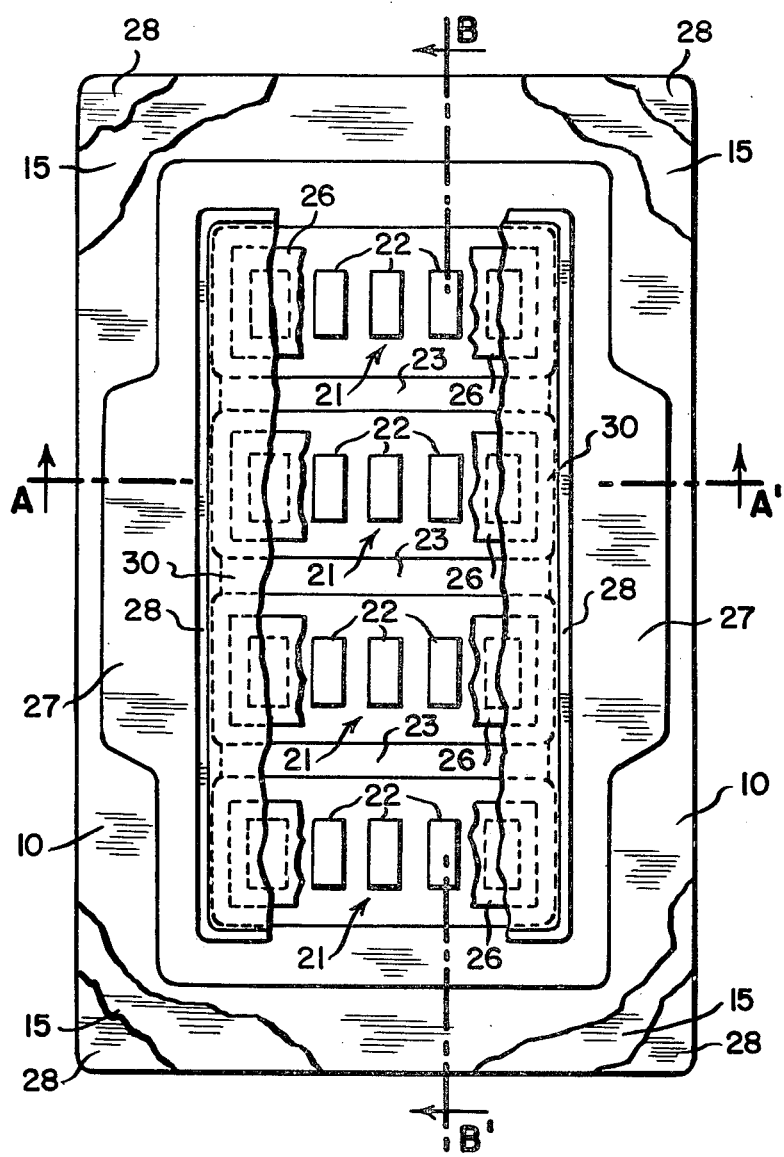
FIG. 1 is a plan view, with portions successively broken away, of an exemplary high frequency power transistor in accordance with the invention.
Figure 2B:
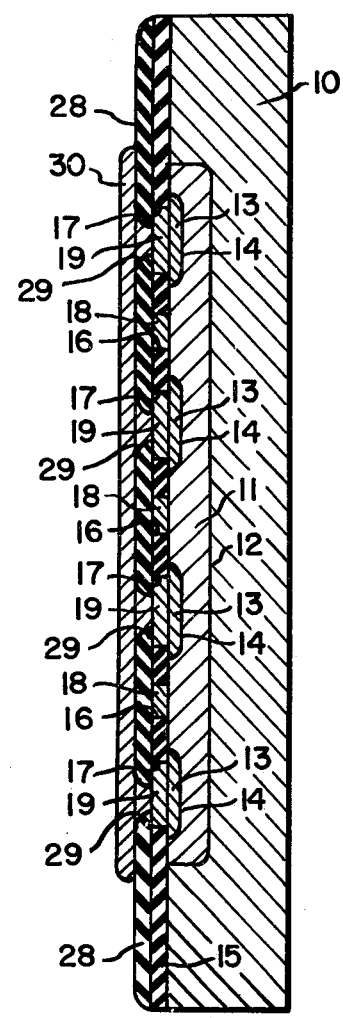
FIGS. 2A and 2B are cross-sectional views of the transistor of FIG. 1 along the lines AA' and BB', respectively.
Figure 2A:
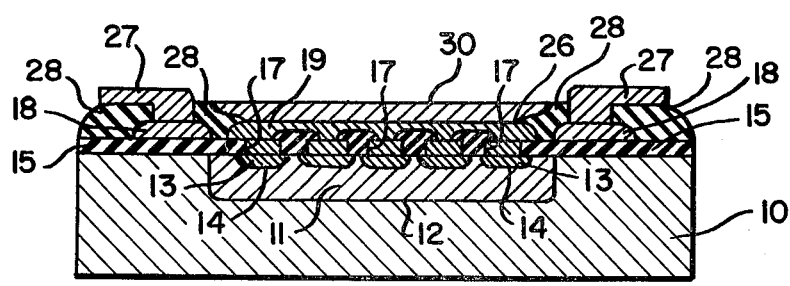

Referring to the drawings, FIGS. 1 and 2 illustrate an exemplary high frequency power transistor in accordance with the invention. The transistor has a bottom collector layer 10 of one type of semiconductor material, such as N-type silicon, and a base layer or base pocket 11 of opposite type semiconductor materials, e.g., P-type silicon, overlaying the collector layer and defining a base-collector junction 12 therebetween. Emitter areas 13 of the first type of semiconductor material (N-type) are shown formed in the base layer, defining base-emitter junctions 14. A layer 15 of insulating material such as silicon dioxide overlays the base and emitter areas, and has openings 16 and 17 therein through which suitable conductive metalization extends to form contact areas with base and emitter areas, respectively. Conductive coatings 18 and 19 connect through openings 16 and 17 with respective base and emitter contact areas.

It will be understood that the thicknesses of the various layers are exaggerated for clarity of illustration and the outlines are somewhat idealized. In practice, the diffused layers and metallized layers are ordinarily very thin compared to their lateral dimensions, and the outlines are likely to be somewhat irregular with rounded corners. This irregularity is impractical to illustrate. Also, it will be understood that the number of rows and number of discrete emitter areas along an emitter row may be selected as desired for a particular application.

The configuration illustrated provides a plurality of parallel emitter rows 21 each comprised of a plurality of discrete emitter sites 22; and a plurality of discrete elongated base contact areas 23 interleaved between successive emitter rows. Advantageously the discrete emitter sites 22 are rectangular as shown and uniformly spaced along the respective emitter rows. Similarly, the discrete base contact areas are advantageously rectangular. Conductive emitter contact metal areas 19 extend through the insulating layer 15 to the discrete emitter sites 22, and conductive base contact metal areas 18 extend through the insulating layer 15 to base contact areas 23.

In each emitter row 21, the plurality of constituent emitter contact areas are connected together by a suitable conductive means here shown as conductive coating 19 on insulating layer 15. These conductive coatings comprise a series of parallel strips 26, each extending across a row 21 of emitter sites and making contact with the constituent sites 22.

The base contact areas 23 are connected together by suitable conductive means here shown as a conductive coating 18 on insulating layer 15, having fingers which extend across the base pocket and over the base contact areas making contact therewith. Advantageously, these fingers extend to and make contact with two bonding pads 27 disposed on either side of the base pocket.

A second insulating layer 28 such as a layer of silicon dioxide is disposed over the fingers of coating 18 in the region overlaying the base pocket 11. This layer is provided with openings 29 through which suitable conductive metalization of bonding plate electrode 30 extends to contact metal 19 of strips 26.

Bonding plate 30 overlies insulating layer 28 and a substantial portion of base pocket 11. It is insulated from conductive coating 18 by insulating layer 28, yet it makes direct electrical and thermal contact with emitter sites 22 through contact with the strips 26.

B. Mounting of Preferred Embodiment

The resulting transistor can be conventionally mounted in conventional microwave device packaging or "flip chip" mounted. In conventional mounting the collector side of the transistor die is soldered to a metallized layer in the package. The emitters can be connected to the package input line by conventional bonding wire bonded to plate 30 and the base can be preferably connected to the desired package metalization by two bonding wires, one to each of bonding pads 27.

Figure 3:
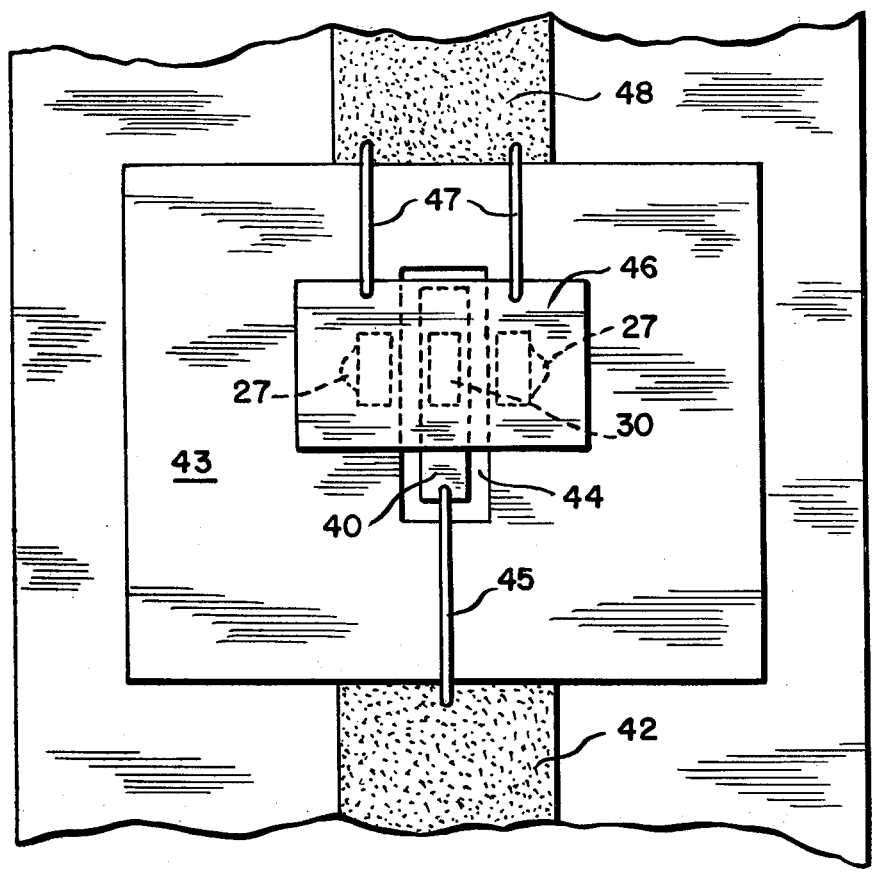
FIG. 3 is a schematic plan view of the transistor of FIGS. 1 and 2 mounted in a flip-chip mounting arrangement.
Figure 4:
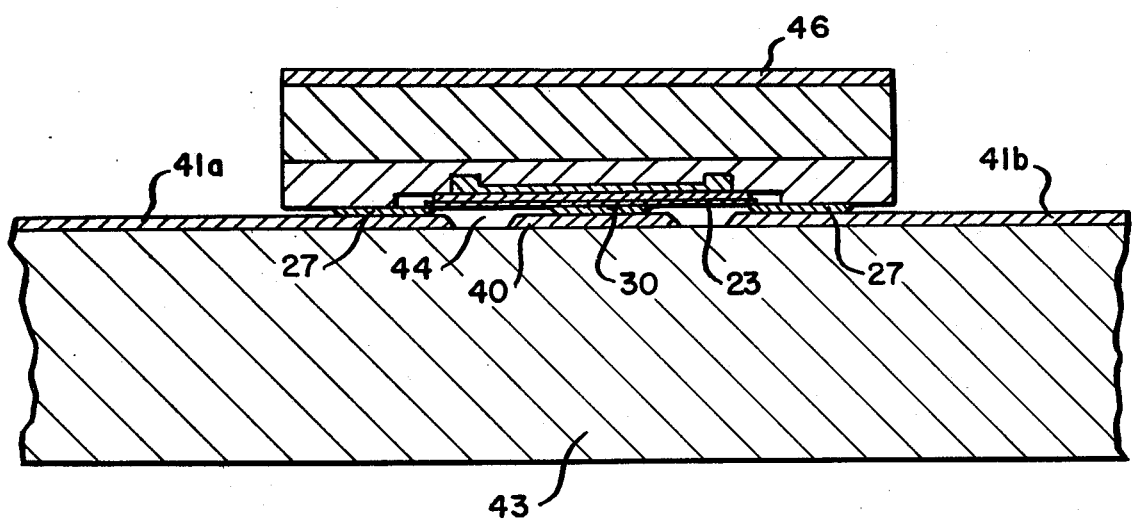
FIG. 4 is a schematic cross-sectional view of the mounting arrangement of FIG. 3.

FIGS. 3 and 4 illustrate schematic plan and cross-sectional views, respectively, of the flip chip mounting of the transistors of FIGS. 1 and 2. Here bonding plates 30 and 27 (two plates) serve as mounting bumps to contact and bond with metallized mount areas 40, 41A and 41B, respectively, of metallized mounting chip 43. An air gap 44 or other suitable insulating means is employed to keep regions 40 and 41 electrically isolated from one another. Bonding wire 45 conveniently connects the isolated emitter contact mount area 40 with the package input strip 42 (for a common base configuration).

As in conventional mounting, the collector side of the transistor die is provided with a thin metal contact layer 46, but unlike its disposition in conventional mounting, the collector side of the die faces away from mounting chip 43 and one or more bonding wires, ribbons or similar conductors 47 are applied to layer 46 to make contact between the collector and the package output line 48. Advantageously, mounting chip 43 is comprised of a good heat conducting material such as beryllium oxide that can act as a heat sink.

C. Fabrication of Preferred Embodiment

The fabrication of transistors in accordance with the invention will now be illustrated by reference to the following exemplary steps applied to the transistor die.

After the collector, base pocket, and emitter sites have been formed, the next step involves opening the insulating layer 15 to define contact openings 16 and 17 and applying metalization to form contact areas with the base and emitter areas. Such metalization can consist of a very thin layer of platinum silicide for good ohmic and low resistance and one or more additional layers of metals such as tungsten, titanium, platinum, and gold for a thickness of 10 to 50 thousand angstroms.

After the metal layers are deposited, they are photoetched to separate the base metalization 18 and the emitter metalization 19. This etching also defines the base electrode fingers and the emitter strips 26.

The next step involves applying the second insulating layer 28 which can be 10-30 thousand angstroms of silicon dioxide deposited by conventional silane deposition techniques. Layer 28 is then photoetched to define openings 29 for contacting strips 26. The metalization for bonding plates 27 and 30 is then applied, comprising one or more thin layers of metals such as tungsten, titanium, platinum and gold and a thick plate of electrically conductive metal such as aluminum or gold to a thickness of 30 thousand angstroms or more. This metal is then etched to separate and define plates 27 and 30. The transistor is then tested and mounted as described hereinabove.

Transistors employing this contact structure have enhanced electrical characteristics. Since the base currents are fed into each base by two separate and equal paths, as opposed to one path for conventional designs, the base inductance is halved. Two base bond wires can be used for each transistor, resulting in lower base terminal, chip-to-package inductance, thus allowing efficient device operation at higher frequencies and simplifying impedance matching for broadbanding. For the same reason, the interconnection resistance is also reduced.

In addition, because the emitter plate in this structure has elevated the bond pads to the top metal layer, the MOS capacitance between the bond pad and the silicon substrate is substantially reduced. The result is a lower collector-to-base capacitance which improves the frequency response of the device and facilitates broadbanding.

The device has also been found to exhibit lower voltage drops than conventional transistors in both the emitter and base metal pattern contacts.

As a result of these enhanced electrical characteristics, conventionally mounted transistors in accordance with the invention have been found to exhibit a frequency response 30% higher than conventionally mounted conventional transistors.

Moreover, if a flip chip mounting is used, this transistor also has a substantially reduced thermal resistance as compared to conventional high frequency power transistors. Metal plate 30, not only overlies the active, heat generating collector-base junction region, but is in direct thermal contact with the silicon substrate through metal strips 26 and coatings 19. As a consequence, the transistor has enhanced heat dissipating capability and a greater operating life expectancy.

While the invention has been described in connection with only the preferred embodiments, it is to be understood that this is merely illustrative of the many other specific embodiments which also utilize the principles of the invention. Numerous and varied devices can be made by those skilled in the art without departing from the spirit and scope of the invention.

I claim:

1. In a microwave power transistor of the type comprising a base pocket active area capable of generating heat to be removed, a plurality of spaced emitter rows within the boundaries of said base pocket and a plurality of discrete base areas closely spaced between successive spaced emitter rows, an improved electrical contact structure comprising:
   bonding pad means on two sides of said base pocket active area;
   a finger electrode structure for making electrical contact with said discrete base areas, said fingers extending across said base pocket active area for making electrical contact with said bonding pad means;
   an insulating layer overlying said finger electrode structure in the region overlying said base pocket active area; and
   emitter bonding plate means for making electrical contact with said emitter rows, said emitter bonding plate means overlying at least a portion of said base pocket active area and being insulated from said finger electrode structure by said insulating layer.

2. A transistor according to claim 1 wherein each of said emitter rows comprises a plurality of emitter sites connected together by a contact strip of conductive material.

3. A transistor according to claim 1 wherein said emitter bonding plate means overlies substantially all of said active area.

4. A high frequency power transistor comprising:
   a collector layer of a first type of semiconductor material;
   a base pocket layer of opposite type of semiconductor material overlaying said collector layer and defining therewith a base-collector junction;
   a plurality of rows of spaced emitter areas of said first type of semiconductor material extending into said base pocket layer to form base-emitter junctions around the peripheries of said emitter areas;
   a first insulating layer overlying said base layer;
   a plurality of openings extending through said first insulating layer to said emitter areas;
   a plurality of openings extending through said first insulating layer to a plurality of discrete portions of said base pocket layer;
   conductive base contact means connecting said plurality of discrete portions of said base pocket layer to enlarged contact regions on one or more sides of said base pocket;
   a second insulating layer overlying said conductive base contact means in the region overlying said base pocket layer; and
   conductive emitter contact means overlying and contacting said emitter areas and overlying said second insulating layer in regions overlying said conductive base contact means, said conductive emitter contact means being insulated from said conductive base contact means by said second insulating layer.

* * * * *